US007961892B2

(12) United States Patent
Fedigan

(10) Patent No.: US 7,961,892 B2
(45) Date of Patent: Jun. 14, 2011

(54) APPARATUS AND METHOD FOR MONITORING SPEAKER CONE DISPLACEMENT IN AN AUDIO SPEAKER

(75) Inventor: Stephen John Fedigan, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1254 days.

(21) Appl. No.: 10/628,159

(22) Filed: Jul. 28, 2003

(65) Prior Publication Data

US 2005/0025317 A1 Feb. 3, 2005

(51) Int. Cl.
*H04R 29/00* (2006.01)
*H04R 3/00* (2006.01)
*H03G 5/00* (2006.01)

(52) U.S. Cl. ................ 381/59; 381/56; 381/58; 381/98; 381/117

(58) Field of Classification Search .................... 381/55, 381/96, 56–59, 117, 412, 400, 403, 420, 381/98
See application file for complete search history.

(56) References Cited

U.S. PATENT DOCUMENTS 3,047,661 A * 7/1962 Winker ........................... 381/96
3,821,473 A 6/1974 Mullins
4,207,430 A 6/1980 Harada et al.
4,243,839 A 1/1981 Takahashi et al.
4,312,118 A * 1/1982 Saik et al. ....................... 29/594
4,360,707 A * 11/1982 Joseph et al. ................. 381/117
4,550,430 A 10/1985 Meyers
4,573,189 A 2/1986 Hall
4,609,784 A 9/1986 Miller
4,727,584 A 2/1988 Hall
4,821,328 A 4/1989 Drozdowski
5,197,104 A * 3/1993 Padi ................................ 381/96
5,493,620 A * 2/1996 Pulfrey ........................... 381/96
6,940,992 B2 * 9/2005 Stiles ............................ 381/412
7,110,564 B2 * 9/2006 Son ............................... 381/396

* cited by examiner

*Primary Examiner* — Devona E Faulk

(74) *Attorney, Agent, or Firm* — Robert D. Marshall, Jr.; W. James Brady; Frederick J. Telecky, Jr.

(57) ABSTRACT

An apparatus for monitoring speaker cone displacement in an audio speaker includes: (a) an electromagnetic coil structure; (b) a ferrous core structure; the ferrous core structure and the electromagnetic coil structure being mounted with the speaker to effect variable electromagnetic coupling between the ferrous core structure and the electromagnetic coil structure as the speaker cone moves; (c) a signal injecting circuit coupled with the electromagnetic coil structure for injecting a predetermined input signal into the electromagnetic coil structure; and (d) a signal monitoring circuit coupled with the electromagnetic coil structure; the signal monitoring circuit receiving an output signal from the electromagnetic coil structure and generating an indicating signal based upon the output signal; at least one signal characteristic of the indicating signal being related with the cone displacement.

7 Claims, 7 Drawing Sheets

120

APPARATUS AND METHOD FOR MONITORING SPEAKER CONE DISPLACEMENT IN AN AUDIO SPEAKER

BACKGROUND OF THE INVENTION

The present invention is directed to audio speakers, sometimes referred to as loudspeakers, and especially to reducing distortion caused by non-linear characteristics in audio speakers.

In recent years, loudspeaker engineers have begun employing various servo-related technologies in the design of loudspeakers seeking to reduce distortion and modify the dynamics of the speaker and its enclosure. For example, in a subwoofer, cone excursions can be quite large, especially at low frequencies, leading to suspension non-linearities that result in significant distortion. Motional feedback signals combined with carefully designed compensators can alleviate these distortion problems. In addition, motional feedback signals can be employed to modify the suspension properties allowing designers to modify the speaker's response without having to physically modify the enclosure or the speaker design. Important impediments to widespread adoption of such technologies have been the costs associated with implanting sensors in the diaphragm of the speaker to measure or monitor cone motion and the size and mass of the sensors. The costs reduced profit margins sufficiently to make the improvements unattractive. The size has been a design challenge for small, compact speaker units of the sort often sought in today's market. If the mass of a sensor is too great it will interfere with or skew the performance of a speaker.

U.S. Pat. No. 3,047,661 to Winker for "High Fidelity Audio System", issued Jul. 31, 1962, discloses an arm in contact with a speaker cone for operating a sensor. The arm responds to motion by the speaker cone to actuate any of a variety of transducers: capacitive (Winker; FIGS. 1 and 2), ionization chamber (Winker; FIG. 3) and resistance bridge (Winker; FIG. 4). It is important that the indication of speaker cone movement be as directly associated with the movement as possible and interfere with the movement as little as possible. The mass of the sensor in contact with the speaker should preferably be small as compared to the mass of the speaker cone. It would be advantageous to avoid moving the masses associated with actuating Winker's various disclosed embodiments of transducers to reduce the affect the sensor arm has upon motion of the speaker cone and to more directly indicate that movement.

Another approach to sensing movement of a speaker cone is disclosed in U.S. Pat. No. 4,727,584 to Hall for "Loudspeaker with Motional Feedback", issued Feb. 23, 1988. Hall discloses mounting an accelerometer on a loudspeaker coil. However, such an arrangement requires providing electrical leads to the accelerometer. Hall's apparatus adds mass and bulk that can skew indications of cone motion, risk wire breakage from metal fatigue associated with motion of the cone and limit how compactly the speaker may be made. Other aspects of Hall's apparatus, such as a requirement for a dust cap, add further to the cost and bulk to a speaker.

U.S. Pat. No. 3,821,473 to Mullins for "Sound Reproduction System with Driven and Undriven Speakers and Motional Feedback", issued Jun. 28, 1974, discloses using other types of sensors mounted within the speaker cone on the face of the driving transducer. Mullins discloses using a variety of sensing technologies for his sensors, including "piezoelectric, piezoresistive, strain gauges, pressure sensitive paint, mass balance or any other transducer which will produce an output that is proportional to acceleration" [Mullins; Col. 4, lines 54-57].

Others have attempted to provide indication of speaker cone motion using a variety of electromagnetic coil structures coaxially arranged with the speaker voice coil. Such apparatuses add complexity, cost and bulk to a speaker. Examples of such coaxially arranged electromagnetic coil structures are U.S. Pat. No. 4,243,839 to Takahashi et al. for "Transducer with Flux Sensing Coils", issued Jan. 6, 1981; U.S. Pat. No. 4,550,430 to Meyers for "Sound Reproducing System Utilizing Motional Feedback and an Improved Integrated Magnetic Structure", issued Oct. 29, 1985; U.S. Pat. No. 4,573,189 to Hall for "Loudspeaker with High Frequency Motional Feedback", issued Feb. 25, 1986; U.S. Pat. No. 4,609,784 to Miller for "Loudspeaker with Motional Feedback", issued Sep. 2, 1986; and U.S. Pat. No. 5,197,104 to Padi for "Electrodynamic Loudspeaker with Electromagnetic Impedance Sensor Coil", issued Mar. 23, 1993.

Another approach to sensing motion of speaker cones has been to use Hall Effect sensors, as disclosed in U.S. Pat. No. 4,821,328 to Drozdowski for "Sound Reproducing System with Hall Effect Motional Feedback", issued Apr. 11, 1989. Drozdowski's apparatus requires including a Hall Effect sensor within the cone and providing electrical leads for communicating with the sensor from outside the cone. It is a complex arrangement fraught with opportunities for breakdown and adds cost, bulk and mass to a speaker.

Yet another approach to monitoring speaker cone motion has involved the use of optical sensor technology, as disclosed in U.S. Pat. No. 4,207,430 to Harada et al. for "Optical Motional Feedback", issued Jun. 10, 1980. A significant problem with using optical sensor systems in addition to adding complexity, cost, mass and bulk is that they are subject to being rendered less efficient, unreliable or even inoperative by dust or other debris buildup.

There is a need for an inexpensive, low mass and compact apparatus and method for monitoring or measuring speaker cone displacement in audio speakers that does not significantly affect operation of a speaker.

SUMMARY OF THE INVENTION

An apparatus for monitoring speaker cone displacement in an audio speaker includes: (a) an electromagnetic coil structure; (b) a ferrous core structure; the ferrous core structure and the electromagnetic coil structure being mounted with the speaker to effect variable electromagnetic coupling between the ferrous core structure and the electromagnetic coil structure as the speaker cone moves; (c) a signal injecting circuit coupled with the electromagnetic coil structure for injecting a predetermined input signal into the electromagnetic coil structure; and (d) a signal monitoring circuit coupled with the electromagnetic coil structure; the signal monitoring circuit receiving an output signal from the electromagnetic coil structure and generating an indicating signal based upon the output signal; at least one signal characteristic of the indicating signal being related with the cone displacement.

A method for monitoring speaker cone displacement in an audio speaker includes the steps of: (a) in no particular order: (1) providing an electromagnetic coil structure; (2) providing a ferrous core structure; (3) providing a signal injecting circuit coupled with the electromagnetic coil structure; and (4) providing a signal monitoring circuit coupled with the electromagnetic coil structure; (b) mounting the ferrous core structure and the electromagnetic coil structure with the speaker to effect variable electromagnetic coupling between the ferrous core structure and the electromagnetic coil structure as the speaker cone moves; (c) operating the signal injecting circuit to inject a predetermined input signal into the electromagnetic coil structure; and (d) operating the signal monitoring circuit to receive an output signal from the electromagnetic coil structure and generate an indicating signal based on the output signal; at least one signal characteristic of the indicating signal being related with the cone displacement.

It is, therefore, an object of the present invention to provide an inexpensive and compact apparatus and method for monitoring or measuring speaker cone displacement in audio speakers that does not significantly affect operation of a speaker.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
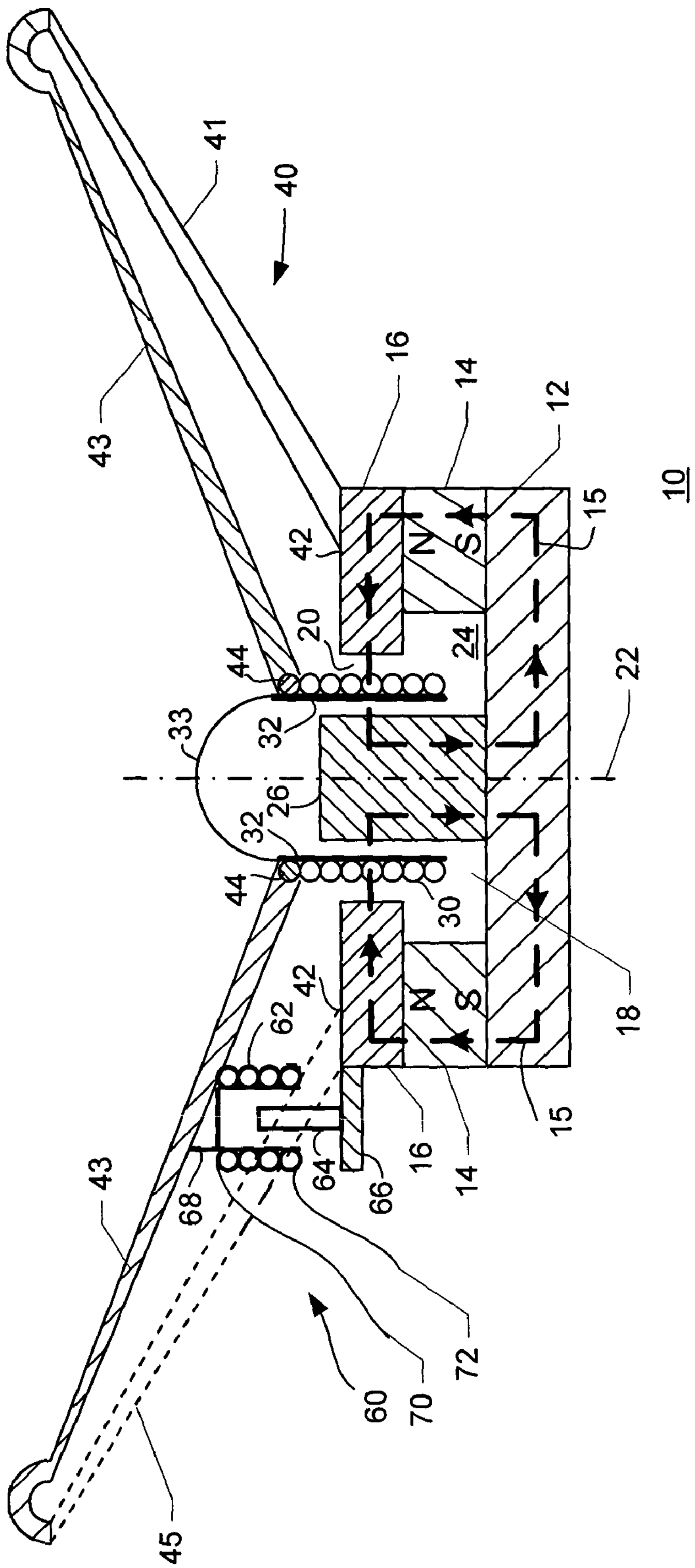
FIG. 1 is a schematic partial section diagram of a speaker using a first embodiment of the apparatus of the present invention.

FIG. 1 is a schematic partial section diagram of a speaker using a first embodiment of the apparatus of the present invention. In FIG. 1, a speaker 10 includes a bottom plate 12, a permanent magnet 14 affixed to bottom plate 12 and a top plate 16 affixed to permanent magnet 14. Permanent magnet 14 has an aperture 18 substantially oriented about an axis 22. Permanent magnet 14 has a north pole N and a south pole S. Top plate 16 has an aperture 20 oriented about axis 22. Apertures 18, 20 cooperate with bottom plate 12 to establish a cavity 24 within which is affixed a ferrous pole piece 26. A voice coil 30 is situated in part within cavity 24 oriented about pole piece 26 wound upon a voice coil bobbin 32. An air gap is established between voice coil 30 and top plate 16 when speaker 10 is in an assembled orientation with pole piece 26, bobbin 32 and voice coil 30 installed in cavity 24. A dust cap 33 may be integrally formed with or attached to bobbin 32. In the assembled orientation, magnetic flux (indicated by flux lines 15) from permanent magnet 14 cuts through voice coil 32. This assembled orientation of speaker 10 establishes a magnetic circuit which is energized by permanent magnet 14. Flux 15 from the magnetic circuit flows from north face N of magnet 14 across ferromagnetic material in top plate 16, across air gap 20, down pole piece 26, and returns to south face S of magnet 14 via bottom plate 12.

A speaker cone structure 40 includes a plurality of substantially rigid support struts 41, 45 supporting a flexible cone 43. There are a plurality of struts (represented by struts 41, 45 in FIG. 1) distributed to support cone 43. Struts 41, 45 are affixed at a first substantially circular termination locus 42 upon top plate 16. Termination locus 16 may be integrally formed with struts supporting cone 43 (represented by struts 41, 45). Cone 43 is affixed with struts 41, 45 and affixed to bobbin 32 in a second substantially circular termination locus 44.

Voice coil 30 is suspended within the magnetic field of permanent magnet 14 and physically moves within the magnetic field of permanent magnet 14 in response to signals applied to voice coil 30. Details of the structure for suspending voice coil 30 within the magnetic field of permanent magnet 14 are not shown in FIG. 1. The apparatus and method of the present invention are not limited by the suspension arrangement between voice coil 30 and cone 43.

Movement of voice coil 30 is imparted to cone 43 by motion of voice coil 30 and bobbin 32, thereby creating audio tones representing signals applied to voice coil 30. The connection arrangement between voice coil 30 and cone 43 in FIG. 1 is representative only; other connection arrangements between voice coil 30 and cone 43 are known in the art and will not be described here. The apparatus and method of the present invention are not limited by the connection arrangement between voice coil 30 and cone 43.

A sensor apparatus 60 includes an electromagnetic coil structure 62 and a ferrous core structure 64. Ferrous core structure 64 is affixed to a supplemental top plate 66. Supplemental top plate 66 may be configured as an integral portion of top plate 16. Electromagnetic coil structure 62 is affixed to cone 43 at the rear of cone 43 at a postion radially offset from axis 22. Representative strut 45 is indicated in phantom in FIG. 1 to avoid cluttering illustration of sensor apparatus 60. Electromagnetic coil structure 62 is preferably affixed with cone 43 using a wedge 68. Wedge 68 is preferably configured appropriately to cause electromagnetic coil structure 62 to respond to motion by cone 43 in directions substantially parallel with axis 22. Wedge 68 may be eliminated or altered from the described preferred configuration in mounting electromagnetic coil structure 62. The angle between direction of motion of electromagnetic coil structure 62 in response to motion by cone 43 and axis 22 may be mathematically accounted for in signal treatment circuitry (not shown in FIG. 1) handling output signals from sensor apparatus 60.

An input signal may be applied to electromagnetic coil structure 62 via flexible lead wires 70, 72, as will be described in greater detail hereinafter in connection with FIGS. 3-7. Motion of cone 43 effects relative motion between electromagnetic coil structure 62 and ferrous core structure 64. The relative motion affects signals traversing electromagnetic coil structure 62 in ways that can be used to determine the displacement of cone 43.

Cone 43 is generally regarded as moving as a rigid body. In actuality, however, some modal vibration of cone 43 occurs as cone 43 responds to motion by voice coil 30. Such modes of vibration or undulations generally establish nodes or nodal loci in cone 43 that remain substantially unmoved by the modal vibration effects. It is most preferable that sensor apparatus 60 be situated substantially at such a stationary node or nodal locus in order that motion sensed by sensor apparatus 60 is substantially fully attributable to motion by cone 43 as a rigid body without involvement of additional modes of vibration or undulation effects.

Figure 2:
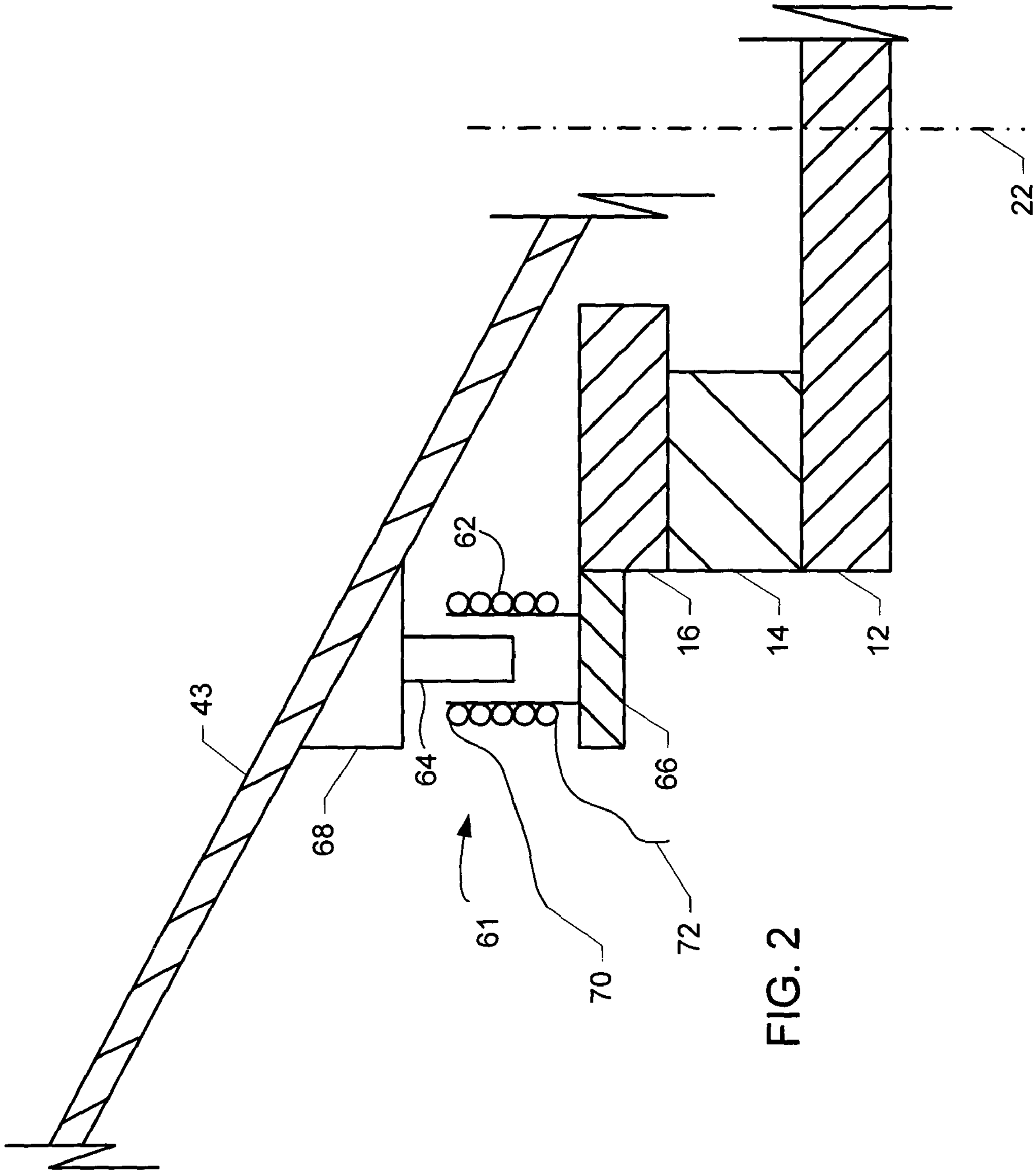
FIG. 2 is a schematic diagram of a portion of a speaker using a second embodiment of the apparatus of the present invention.

FIG. 2 is a schematic diagram of a portion of a speaker using a second embodiment of the apparatus of the present invention. In FIG. 2, sensor apparatus 61 includes an electromagnetic coil structure 62 and a ferrous core structure 64. Electromagnetic coil structure 62 is affixed to a supplemental top plate 66. Supplemental top plate 66 may be configured as an integral portion of top plate 16. Ferrous core structure 64 is affixed to cone 43 at the rear of cone 43. Ferrous core structure 64 is preferably affixed with cone 43 using wedge 68. Wedge 68 is preferably configured appropriately to cause ferrous core structure 64 to respond to motion by cone 43 in directions substantially parallel with axis 22. Wedge 68 may be eliminated or altered in mounting ferrous core structure 64. The angle between direction of motion of ferrous core structure 64 in response to motion by cone 43 and axis 22 may be mathematically accounted for in signal treatment circuitry (not shown in FIG. 2).

An input signal may be applied to electromagnetic coil structure 62 via lead wires 70, 72, as will be described in greater detail hereinafter in connection with FIGS. 3-7. Motion of cone 43 effects relative motion between electromagnetic coil structure 62 and ferrous core structure 64. The relative motion affects signals traversing electromagnetic coil structure 62 in ways that can be used to determine the displacement of cone 43.

Cone 43 is generally regarded as moving as a rigid body. In actuality, however, some modal vibration or undulation of cone 43 occurs as cone 43 responds to motion by voice coil 30 (see FIG. 1). Such modes of vibration generally establish nodes or nodal loci in cone 43 that remain substantially unmoved. It is most preferable that sensor apparatus 61 be situated substantially at a node or nodal locus in order that motion sensed by sensor apparatus 61 is substantially fully attributable to motion by cone 43 as a rigid body without involvement of additional modal vibration or undulation effects.

Figure 3:
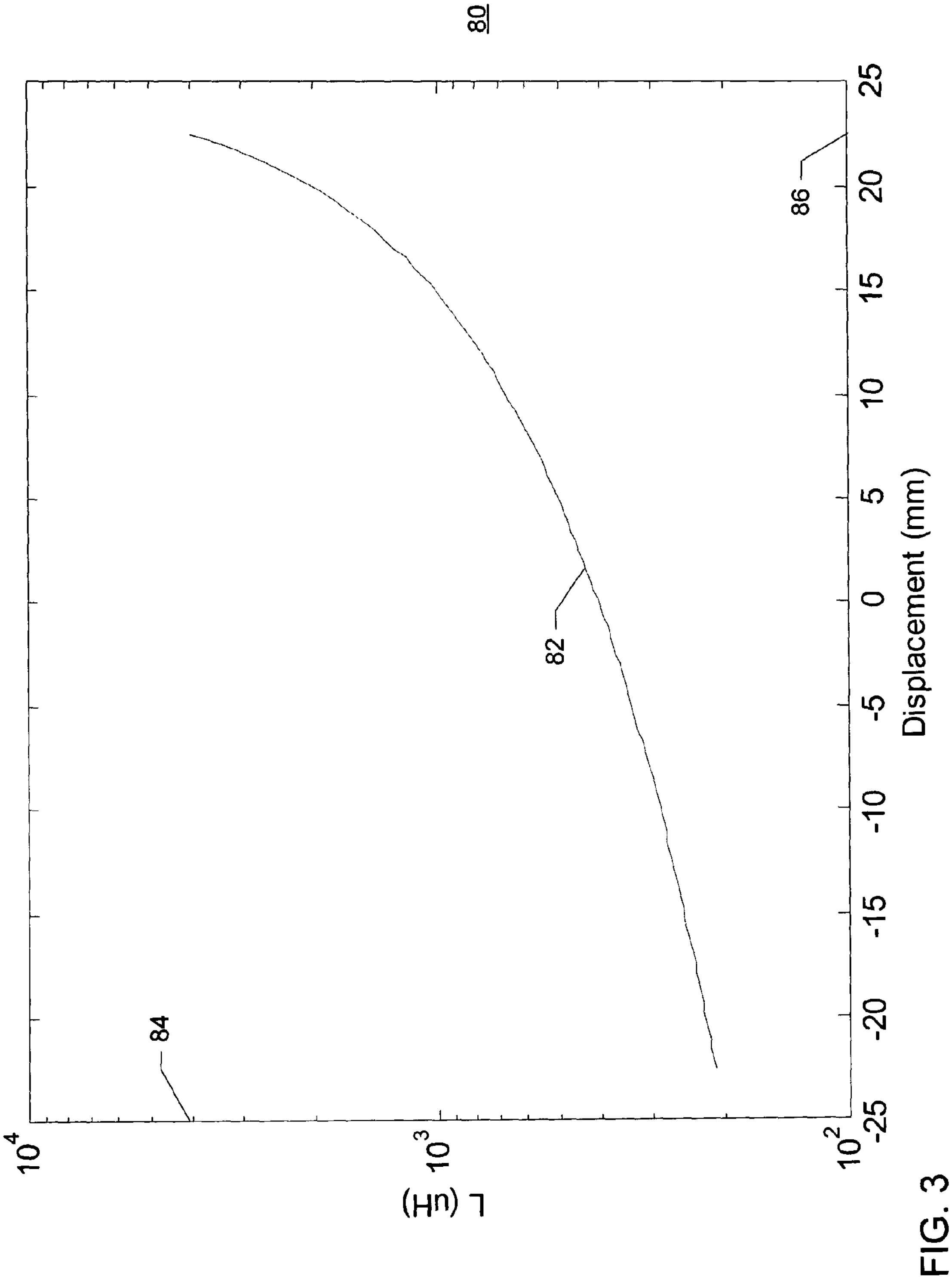
FIG. 3 is a graphic representation of inductance as a function of displacement of a cone in a speaker using the apparatus of the present invention.

FIG. 3 is a graphic representation of inductance as a function of displacement of a cone in a speaker using the apparatus of the present invention. In FIG. 3, a graphic plot 80 displays a response curve 82 plotted on a first axis 84 indicating inductance (measured in micro Henries; μH) as a function of cone displacement indicated on a second axis 86 (measured in millimeters; mm). As indicated in FIG. 3, displacement of cone 43 (FIGS. 1 and 2) may be readily monitored or measured by observing inductance in electromagnetic coil structure 62 as electromagnetic coil structure 62 and ferrous core structure 64 experience relative movement with respect to each other in response to motion by cone 43. Over a range of approximately 3800 μH (axis 84) displacement ranges somewhat over 40 millimeters. Response curve 82 is substantially linear over a range of about −20 mm to +10 mm. The displacement 0 mm indicates an at-rest, not-displaced locus of cone 43.

Figure 4:
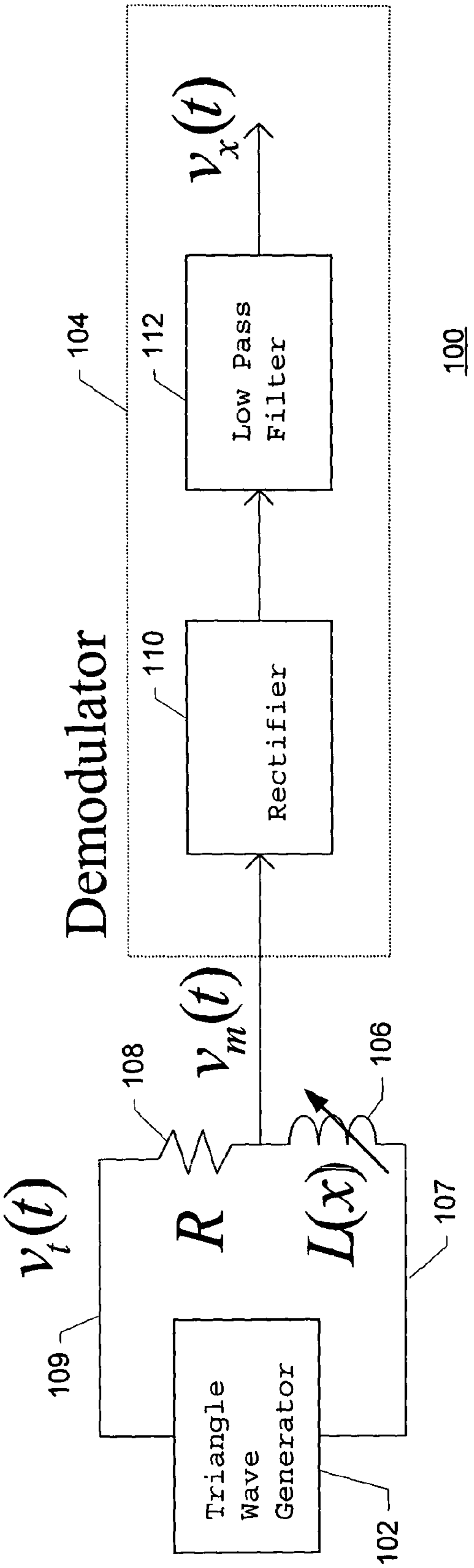
FIG. 4 is a schematic diagram of the evaluation circuitry used with the apparatus of the present invention.

FIG. 4 is a schematic block diagram of the evaluation circuitry used with the apparatus of the present invention. As mentioned earlier herein in connection with describing FIGS. 1 and 2, when an input signal is applied to electromagnetic coil structure 62 via lead wires 70, 72 and motion of cone 43 effects relative motion between electromagnetic coil structure 62 and ferrous core structure 64, the relative motion affects signals traversing electromagnetic coil structure 62 in ways that can be used to determine the displacement of cone 43. FIG. 4 illustrates the preferred embodiment of evaluation circuitry that includes a signal injecting circuit for applying input signals to electromagnetic coil structure 62 and a signal receiving circuit for receiving signals from electromagnetic coil 62 to monitor or measure displacement of cone 43. In FIG. 4, evaluation circuitry 100 includes a signal injecting circuit 102 and a signal receiving circuit 104. Signal injecting circuit 102 is embodied in a preferred embodiment as a triangle wave generator 102 and signal receiving circuit 104 is embodied in a preferred embodiment as a demodulator circuit 104. Triangle wave generator 102 injects a time-varying triangle wave signal $V_t(t)$ (to be described in greater detail hereinafter in connection with FIG. 5) into a variable inductor 106 (representing electromagnetic coil structure 62; FIGS. 1 and 2) via a resistor 108. Inductance L of inductor 106 varies, for example, as a function of relative motion of electromagnetic coil 62 and ferrous core 64 (FIGS. 1 and 2) caused by displacement of cone 43, hence the annotation L(x) indicating inductance L is a function of x (i.e., displacement) for inductor 106 in FIG. 4. Lines 107, 109 are embodiments of lead wires 70, 72 (FIGS. 1 and 2). A time-varying output signal $V_m(t)$ is generated for receiving by demodulator circuit 104. The annotation "m" indicates that input signal $V_t(t)$ has been modulated by the influence of inductor 106, an influence that is related to the displacement of cone 43 (FIGS. 1 and 2).

Demodulator circuit 104 preferably includes a rectifier 110 coupled with a low pass filter 112. Signal $V_m(t)$ is received by rectifier 110 and treated before presentation to low pass filter 112. Low pass filter 112 further treats the signal received from rectifier 110 and presents an output signal $V_x(t)$. Output signal $V_x(t)$ is related to displacement of cone 43, as indicated by the annotation "x".

Resistor 108 and inductor 106 cooperate to operate as a high pass filter. Preferably, the triangle wave injected by triangle wave generator 102 is at a frequency substantially below the corner frequency of the high pass filter (resistor 108 and inductor 106) so that the high pass filter may reliably differentiate the input waveform $V_t(t)$. The differentiated signal is a time varying square wave signal $V_m(t)$ whose amplitude varies with the position of electromagnetic coil structure 62 with respect to ferrous core structure 64 (i.e., amplitude varies as a function of x). Changes in square wave signal $V_m(t)$ are detected by rectifier 110 followed by low pass filter 112. The variation of output voltage $V_x(t)$ indicates variation of the position of electromagnetic coil structure 62 with respect to ferrous core structure 64. The position of electromagnetic coil structure 62 with respect to ferrous core structure 64 is directly related to the position of cone 43. Thus, the position or motion of cone 43 may be monitored and measured.

Figure 5:
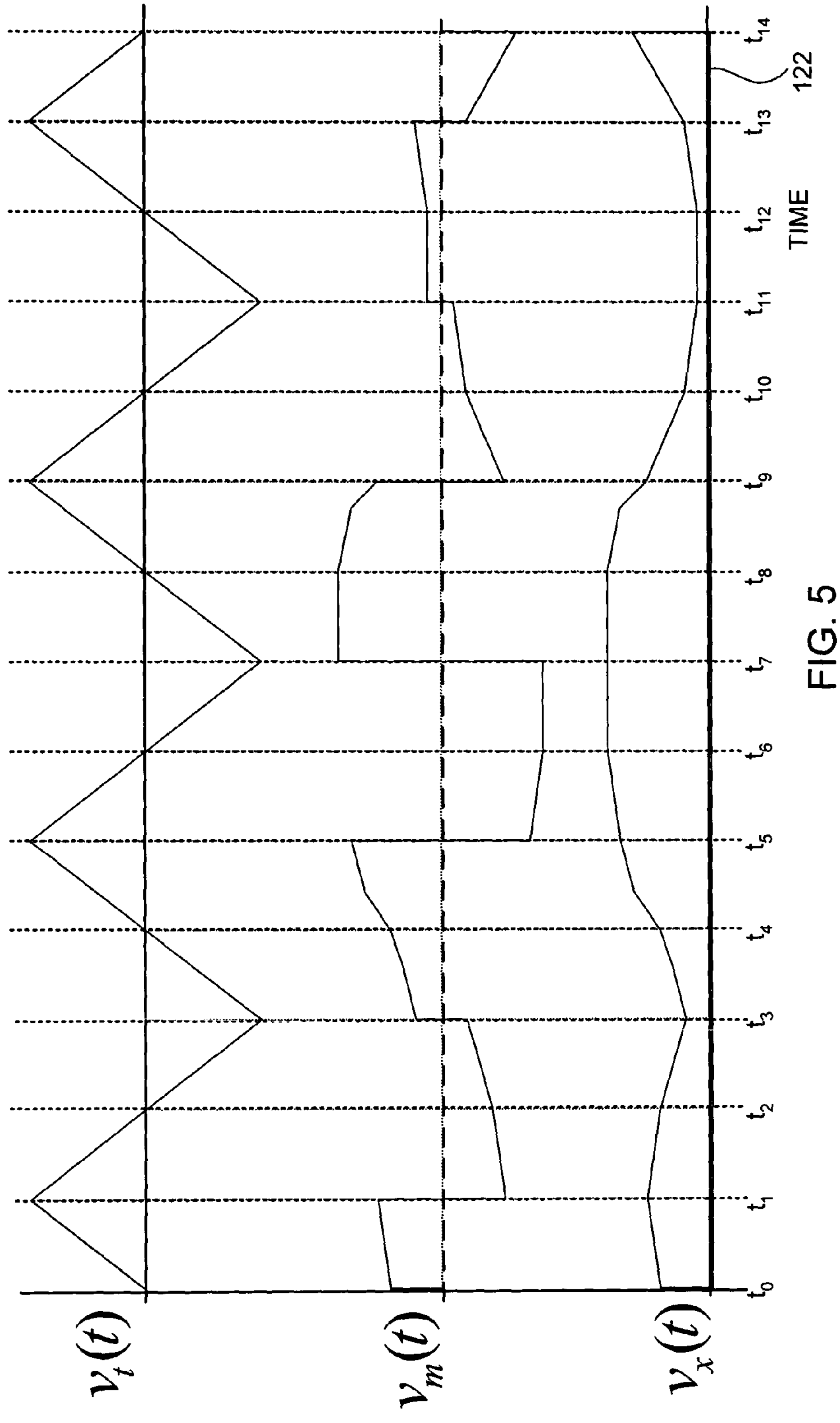
FIG. 5 is a graphic representation of voltages at various loci in FIG. 4, as a function of time.

FIG. 5 is a graphic representation of voltages at various loci in FIG. 4, as a function of time. In FIG. 5, a graphic plot 120 illustrates a representative input signal $V_t(t)$, a representative modulated voltage $V_m(t)$ and a representative output voltage $V_x(t)$ (FIG. 4) are presented on a common time scale 122. Input signal $V_t(t)$ may be any time-varying periodic signal other than a square wave. It is preferred that input signal $V_t(t)$ be a triangular wave principally because a triangular wave is easy, reliable and inexpensive to generate. No complex or precision electronics are required to generate a triangular wave.

In FIG. 5, input signal $V_t(t)$ is a triangular wave having positive peaks at times $t_1$, $t_5$, $t_9$, $t_{13}$, having negative peaks at times $t_3$, $t_7$, $t_{11}$ and having zero crossings at times $t_0$, $t_2$, $t_4$, $t_6$, $t_8$, $t_{10}$, $t_{12}$, $t_{14}$.

Modulated signal $V_m(t)$ is created using the differentiating action of the high pass filter established by resistor 108 and inductor 106 (FIG. 4), as modulated by the varying inductance occurring in inductor 106 because of motion of cone 43 (FIGS. 1 and 2). Thus, the slope of input signal $V_t(t)$ is differentiated to establish maximum excursion of modulated signal $V_m(t)$. Modulated signal $V_m(t)$ indicates a representative pattern of motion by cone 43 in two directions from a reference point (usually an at-rest point; a point at which cone 43 is not deflected). Modulated signal $V_m(t)$ is a substantially square wave signal deviating in a positive direction indicating movement of cone 43 in a first direction, and deviating in a negative direction indicating movement of cone 43 in a second direction opposite from the first direction.

Output signal $V_x(t)$ is the resultant signal after modulated signal $V_m(t)$ is treated by rectifier 110 and low pass filter 112. Rectifier 110 establishes output signal $V_x(t)$ as the absolute value of modulated signal $V_m(t)$. Low pass filter "cleans up" the signal received from rectifier 110 to remove signal imperfections that may have been introduced by noise, distortion or other anomalies in input signal $V_t(t)$, introduced by operation of rectifier 110 or introduced elsewhere in evaluation circuitry 100 (FIG. 4). Use of low pass filter 112 permits lesser precision in components used in evaluation circuitry 100, thereby making evaluation circuitry 100 less expensive to manufacture and more forgiving in its operation. Low pass filter 112 also filters out signal variations caused by high frequency oscillations due to the non-rigid body modal of vibration or undulation effect of cone 43.

Figure 6:
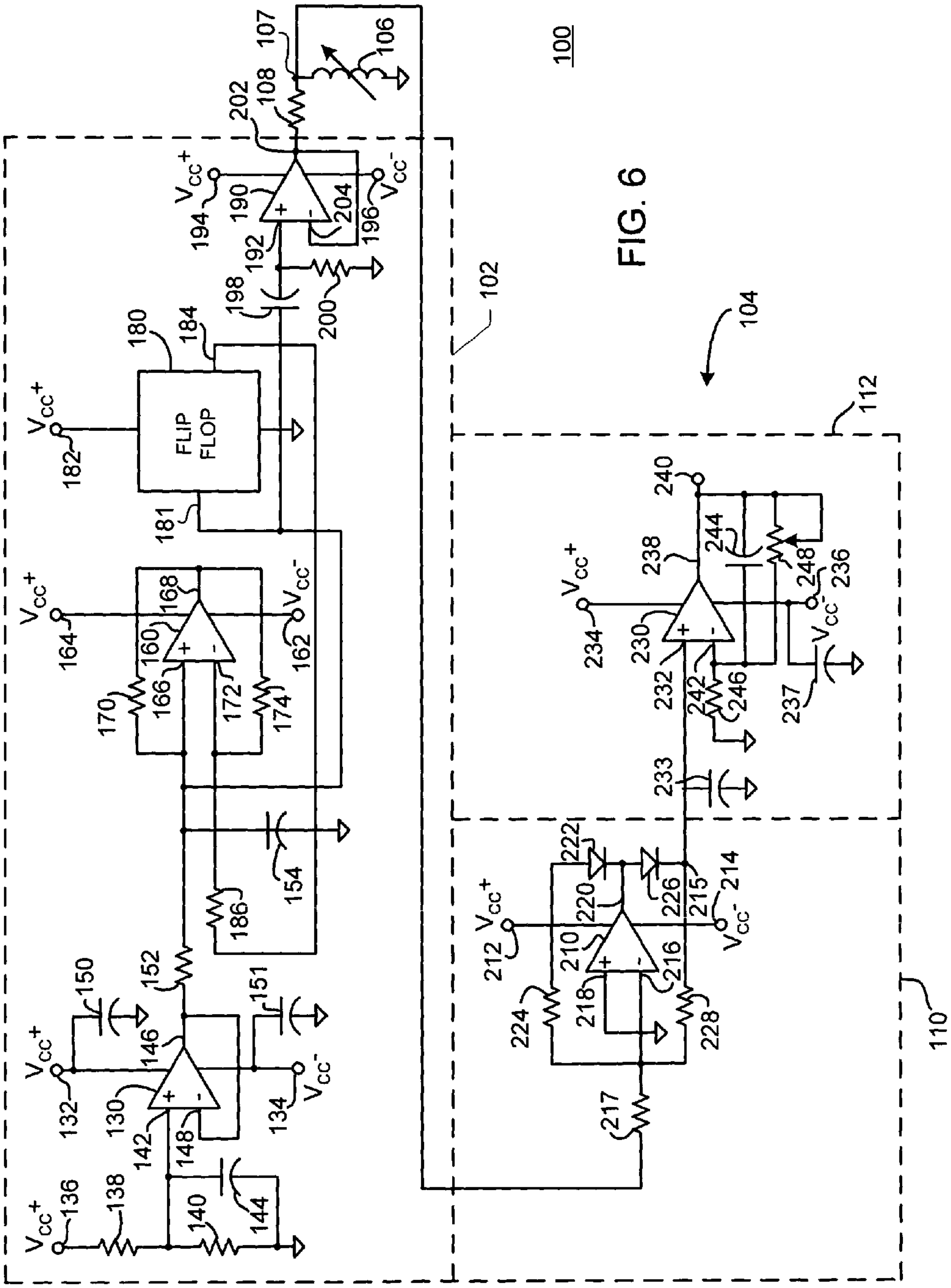
FIG. 6 is a simplified electrical schematic diagram of the preferred embodiment of the evaluation circuitry illustrated in FIG. 4.

FIG. 6 is a simplified electrical schematic diagram of the preferred embodiment of the evaluation circuitry illustrated in FIG. 4. In FIG. 6, evaluation circuitry 100 includes a signal injecting circuit 102 and a signal receiving circuit 104. Signal injecting circuit 102 is preferably embodied as a triangle wave generator 102 and signal receiving circuit 104 is preferably embodied as a demodulator circuit 104 that includes a rectifier 110 and a low pass filter 112.

Triangle wave generator 102 includes an operational amplifier 130 receiving a positive supply signal $V_{cc}$+ at a power supply locus 132 and receiving a negative supply signal $V_{cc}$− at a power supply locus 134. Positive supply voltage $V_{cc}$+ is also provided at an input locus 136. Resistors 138, 140 divide positive supply voltage $V_{cc}$+ to provide an appropriate input signal at a non-inverting input locus 142 of operational amplifier 130. A capacitor 144 filters out alternating current (AC) signals to preclude their being applied at non-inverting input locus 142. Signals appearing at an output locus 146 of operational amplifier 130 are fed back for application at an inverting input locus 148. Capacitors 150, 151 filter out AC signals to preclude their being applied at power supply loci 132, 134.

An operational amplifier 160 receives a positive supply signal $V_{cc}$+ at a power supply locus 164 and receives a negative supply signal $V_{cc}$− at a power supply locus 162. Output signals from output locus 146 of operational amplifier 130 provide an input signal via a resistor 152 to a non-inverting input locus 166 of operational amplifier 160. A capacitor 154 filters out alternating current (AC) signals to preclude their being applied at non-inverting input locus 166. Signals appearing at an output locus 168 of operational amplifier 160 are fed back for application at non-inverting input locus 166 via a resistor 170. Signals appearing at output locus 168 of operational amplifier 160 are also fed back for application at an inverting input locus 172 via a resistor 174.

Signals appearing at non-inverting input locus 166 are also provided to an input locus 181 of a flip flop unit 180. Flip flop unit 180 receives a positive supply signal $V_{cc}$+ at a power supply locus 182. Signals appearing at an output locus 184 of flip flop unit 180 are fed back for application at inverting input locus 172 via a resistor 186. Output signals appearing at output locus 184 of flip flop unit 180 have two possible values: ground and $V_{cc}$+. Output locus 184 is initially set at ground. If output locus 184 is at ground and input locus 181 goes from below ⅔ $V_{cc}$+ to above ⅔ $V_{cc}$+, then output locus 184 will transition from ground to $V_{cc}$+. If output locus 184 is at $V_{cc}$+ and input locus 181 goes from above ⅓ $V_{cc}$+ to below ⅓ $V_{cc}$+, then output locus 184 will transition from $V_{cc}$+ to ground.

Signals appearing at non-inverting input locus 166 of operational amplifier 160 are also provided to a non-inverting input locus 192 of an operational amplifier 190. Operational amplifier 190 receives a positive supply signal $V_{cc}$+ at a power supply locus 194 and receives a negative supply signal $V_{cc}$− at a power supply locus 196. A capacitor 198 and a resistor 200 treat signals received from locus 172 before the signals are applied to non-inverting input 192. Signals appearing at an output locus 202 of operational amplifier 190 are fed back for application at an inverting input locus 204. Signals appearing at output locus 202 of operational amplifier 190 are also applied to an inductor 106 via a resistor 108 (see, for example, resistor 108 and inductor 106; FIGS. 1 and 2).

Triangle wave generator 102 injects time-varying triangle wave signal $V_t(t)$ (FIG. 4) into variable inductor 106 (FIG. 4; representing electromagnetic coil structure 62 of FIGS. 1 and 2) via resistor 108. Inductance L of inductor 106 varies as a function of displacement of cone 43 and a time-varying output signal $V_m(t)$ (FIG. 4) is thereby generated for presentation to demodulator circuit 104. The annotation "m" indicates that input signal $V_t(t)$ has been modulated by the influence of inductor 106, an influence that is related to the displacement of cone 43 (FIGS. 1 and 2).

Demodulator circuit 104 preferably includes a rectifier 110 coupled with a low pass filter 112. Rectifier 110 includes an operational amplifier 210 receiving a positive supply signal $V_{cc}$+ at a power supply locus 212 and receiving a negative supply signal $V_{cc}$− at a power supply locus 214. An inverting input locus 216 of operational amplifier 210 receives input signals (signal $V_m(t)$) from juncture 107 via a resistor 217. Anon-inverting input locus 218 of operational amplifier 210 is coupled to ground. Signals appearing at an output locus 220 of operational amplifier 210 are fed back for application at inverting input locus 216 via diode 222 and resistor 224 as well as via diode 226 and resistor 228.

Low pass filter 112 includes an operational amplifier 230. Operational amplifier 230 receives treated signals $V_m(t)$ from a juncture 215 between diode 226 and resistor 228 at a non-inverting input locus 232. A capacitor 233 filters out alternating current (AC) signals to preclude their being applied at non-inverting input locus 232. Operational amplifier 230 receives a positive supply signal $V_{cc}$+ at a power supply locus 234 and receives a negative supply signal $V_{cc}$− at a power supply locus 236. A capacitor 237 filters out AC signals to preclude their being applied at power supply locus 236. Signals appearing at output locus 238 of operational amplifier 230 are provided as output signal Vx(t) (FIG. 4) at an output locus 240 and are also fed back for application at an inverting input locus 242 via a capacitor 244. A resistor 246 assists in biasing inverting input 242. A variable resistor 248 connected in parallel with capacitor 244 provides time constant and gain adjustment for feedback signals applied at inverting input locus 242.

Figure 7:
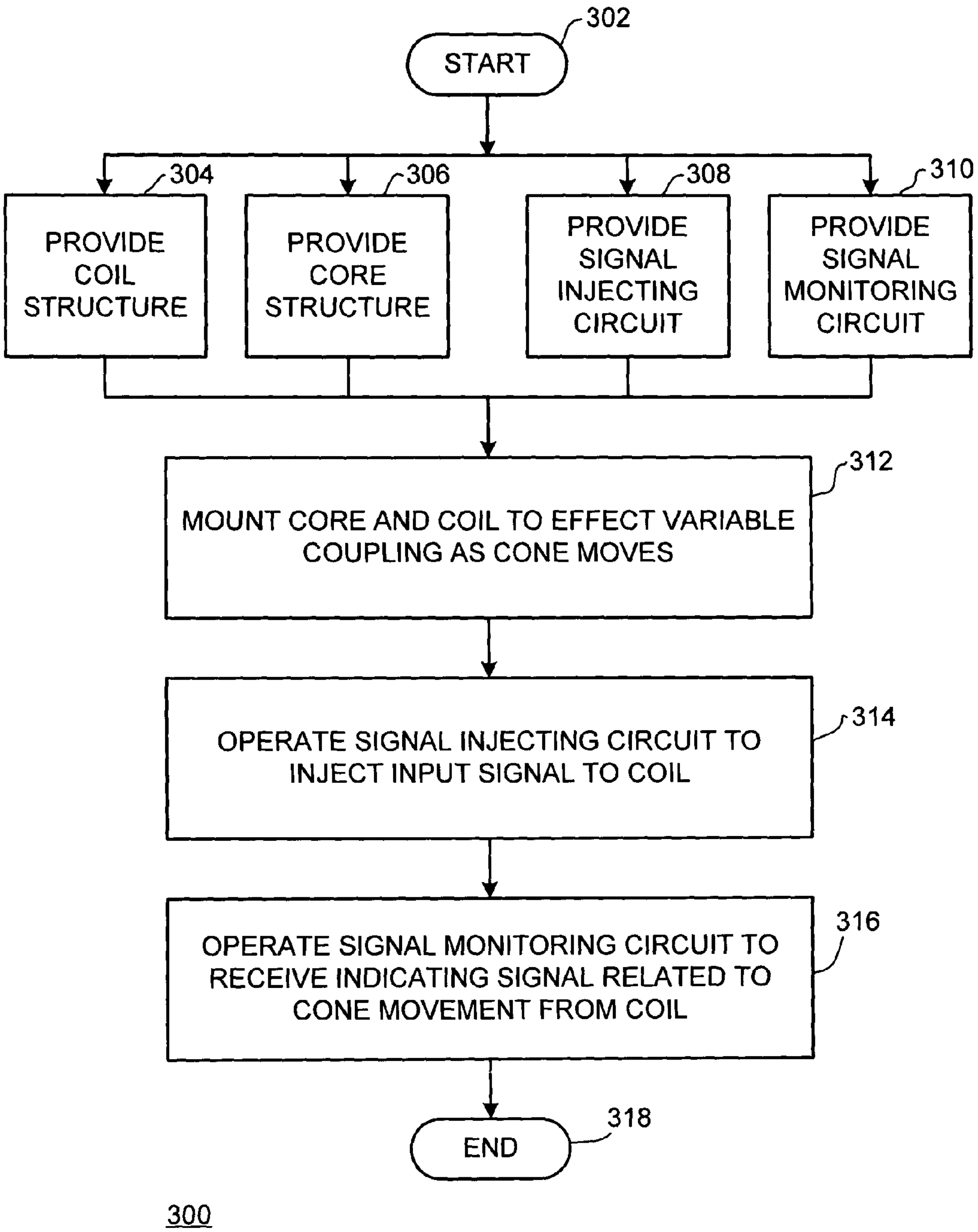
FIG. 7 is a flow diagram illustrating the method of the present invention.

FIG. 7 is a flow diagram illustrating the method of the present invention. In FIG. 7, a method 300 for monitoring speaker cone displacement in an audio speaker begins at a START locus 302. Method 300 continues with the step of, in no particular order: (1) providing an electromagnetic coil structure, as indicated by a block 304; (2) providing a ferrous core structure, as indicated by a block 306; (3) providing a signal injecting circuit coupled with the electromagnetic coil structure, as indicated by a block 308; and (4) providing a signal monitoring circuit coupled with the electromagnetic coil structure, as indicated by a block 310.

Method 300 continues with the step of mounting the ferrous core structure and the electromagnetic coil structure with the speaker to effect variable electromagnetic coupling between the ferrous core structure and the electromagnetic coil structure as the speaker cone moves, as indicated by a block 312.

Method 300 continues with the step of operating the signal injecting circuit to inject a predetermined input signal into the electromagnetic coil structure, as indicated by a block 314.

Method 300 continues with the step of operating the signal monitoring circuit to receive an output signal from the electromagnetic coil structure and generate an indicating signal based on the output signal, as indicated by a block 316. At least one signal characteristic of the indicating signal is related with the cone displacement. Method 300 terminates at an END locus 318.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

I claim:

1. An apparatus for measuring speaker cone displacement relative to a fixed position in an audio speaker having a voice coil aligned with the speaker cone along a central axis, the apparatus comprising:

(a) a variable reluctance sensor device; said sensor device including a first unit fixed relative to said fixed position; and a second unit affixed to said speaker cone effecting relative motion between said first unit and said second unit through motion of said speaker cone at a position on said cone, said first unit and said second unit disposed coaxially about a second axis radially offset from said central axis;

(b) a signal injecting circuit coupled for injecting a predetermined input signal into one of said first and second units; and (c) a signal receiving circuit coupled with said one of said first and second units for receiving a signal resulting from modulation of said input signal due to variation of reluctance of said sensor device caused by displacement of said first unit relative to said second unit, and for generating an indicating signal based upon said resulting signal; at least one signal characteristic of said indicating signal being related with said cone displacement.

2. The apparatus of claim 1, wherein said first unit comprises a core structure; and wherein said second unit comprises a electromagnetic coil structure.

3. The apparatus of claim 1 wherein said second unit is affixed to said speaker cone at a substantially stationary node of any modal vibration of said speaker cone.

4. The apparatus of claim 3, wherein said second unit is mounted on said cone using a wedge.

5. The apparatus of claim 1, wherein said first unit comprises an electromagnetic coil structure; and wherein said second unit comprises a core structure.

6. An apparatus for measuring speaker cone displacement relative to a fixed position in an audio speaker having a voice coil aligned with the speaker cone along a central axis, the fixed position radially offset from the central axis, the apparatus comprising:

(a) a variable reluctance sensor device; said sensor device including a magnetic coil structure fixed relative to said fixed position; and a core structure affixed to said speaker cone coaxial with said magnetic coil structure effecting relative motion between said magnetic coil structure and said core structure through motion of said speaker cone at the fixed position on said cone radially offset from said axis; wherein said electromagnetic coil structure operates as at least part of a high pass filter having a corner frequency;

(b) a signal injecting circuit coupled for injecting a predetermined input signal into said magnetic coil structure; said predetermined input signal has a frequency substantially below said corner frequency; and (c) a signal receiving circuit coupled with said one of said first and second units for receiving a signal resulting from modulation of said input signal due to variation of reluctance of said sensor device caused by displacement of said first unit relative to said second unit, and for generating an indicating signal based upon said resulting signal; at least one signal characteristic of said indicating signal being related with said cone displacement.

7. An apparatus for measuring speaker cone displacement relative to a fixed position in an audio speaker having a voice coil aligned with the speaker cone along a central axis, the fixed position radially offset from the central axis, the apparatus comprising:

(a) a variable reluctance sensor device; said sensor device including a core structure fixed relative to said fixed position; and a magnetic coil structure affixed to said speaker cone coaxial with said core structure effecting relative motion between said core structure and said magnetic coil structure through motion of said speaker cone at the fixed position on said cone radially offset from said axis; wherein said electromagnetic coil structure operates as at least part of a high pass filter having a corner frequency;

(b) a signal injecting circuit coupled for injecting a predetermined input signal into said magnetic coil structure; said predetermined input signal has a frequency substantially below said corner frequency; and (c) a signal receiving circuit coupled with said one of said first and second units for receiving a signal resulting from modulation of said input signal due to variation of reluctance of said sensor device caused by displacement of said first unit relative to said second unit, and for generating an indicating signal based upon said resulting signal; at least one signal characteristic of said indicating signal being related with said cone displacement.

* * * * *